United States Patent
Beginski et al.

(10) Patent No.: US 7,235,806 B2
(45) Date of Patent: Jun. 26, 2007

(54) WAFER EDGE WITH LIGHT SENSOR

(75) Inventors: David A. Beginski, Gilbert, AZ (US);
Richard Crabb, Phoenix, AZ (US);
James Donald, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/439,393

(22) Filed: May 16, 2003

(65) Prior Publication Data

US 2004/0227111 A1 Nov. 18, 2004

(51) Int. Cl.
- G01N 21/86 (2006.01)
- G01V 8/00 (2006.01)
- G06M 7/00 (2006.01)
- G01J 1/04 (2006.01)
- G01J 1/42 (2006.01)

(52) U.S. Cl. ............ 250/559.29; 250/221; 250/227.11; 356/622; 901/30

(58) Field of Classification Search ............... 250/221, 250/222.1, 227.11, 559.29, 559.3, 559.33, 250/559.4; 356/614, 622; 901/30, 35, 46–47
See application file for complete search history.

(56) References Cited

U.S. PATENT DOCUMENTS

| | | |
|---|---|---|
| 3,308,709 A | 3/1967 | Harrick |
| 3,822,946 A | 7/1974 | Rynkowski |
| 4,107,539 A | 8/1978 | Kirsch |
| 4,545,106 A | 10/1985 | Juengel |
| 4,697,089 A | 9/1987 | Drage |
| 4,698,775 A | 10/1987 | Koch et al. |
| 4,730,882 A | 3/1988 | Messerschmidt |
| 4,743,769 A | 5/1988 | Schwaiger |
| 4,951,601 A | 8/1990 | Maydan et al. |
| 5,563,798 A | 10/1996 | Berken et al. |
| 5,651,086 A | 7/1997 | Russell et al. |
| 5,710,069 A | 1/1998 | Farkas et al. |
| 5,729,337 A | 3/1998 | Tanaka |
| 5,783,834 A * | 7/1998 | Shatas ................... 250/559.33 |
| 5,812,714 A | 9/1998 | Hulse |
| 5,841,540 A | 11/1998 | Mondie |
| 5,870,488 A | 2/1999 | Rush et al. |
| 5,870,498 A | 2/1999 | Mayer |
| 6,026,561 A | 2/2000 | Lafond |
| 6,075,606 A | 6/2000 | Doan |
| 6,099,596 A | 8/2000 | Li et al. |
| 6,108,092 A | 8/2000 | Sandhu |
| 6,162,008 A | 12/2000 | Perkins et al. |
| 6,172,756 B1 | 1/2001 | Chalmers et al. |
| 6,197,117 B1 | 3/2001 | Li et al. |
| 6,242,718 B1 | 6/2001 | Ferro et al. |

(Continued)

Primary Examiner—Georgia Epps
Assistant Examiner—Patrick J. Lee
(74) Attorney, Agent, or Firm—Knobbe, Martens, Olson & Bear, LLP.

(57) ABSTRACT

An apparatus for detecting the presence of a substrate that is carried by an end effector of a substrate handling assembly positioned within a substrate processing system comprises a receiving member that is coupled to an end effector and a light sensor that is operatively coupled to the receiving member and is configured to detect an amount light transmitted by the receiving member. In a modified embodiment, the apparatus also includes a transmitting member that receives light from a light source and is also coupled to the end effector.

7 Claims, 12 Drawing Sheets

U.S. PATENT DOCUMENTS

| | | |
|---|---|---|
| 6,293,749 B1 | 9/2001 | Raaijmakers et al. |
| 6,305,898 B1 | 10/2001 | Yamagishi et al. |
| 6,322,116 B1 | 11/2001 | Stevens |
| 6,331,023 B1 | 12/2001 | Goodwin et al. |
| 6,438,449 B2 * | 8/2002 | Kawamatsu et al. ........ 700/229 |
| 6,624,898 B1 * | 9/2003 | Chen ......................... 356/614 |
| 6,665,583 B2 * | 12/2003 | Kretz et al. ................. 700/218 |
| 6,961,639 B2 * | 11/2005 | Gaudon et al. ............. 700/225 |

* cited by examiner

WAFER EDGE WITH LIGHT SENSOR

BACKGROUND OF THE INVENTION

1. Field of the Invention

This present invention relates to substrate processing and, in particular, to methods and apparatus for detecting the presence or position of a substrate located within a substrate processing system.

2. Description of the Related Art

Semiconductor devices, such as transistors, diodes, and integrated circuits, are typically fabricated on a thin slice of semiconductor material, termed a substrate or wafer. The substrate is fabricated within a substrate processing system, which typically includes one or more load locks, a wafer handling module and one or more processing modules. The one or more load locks provide a substantially particle free environment from which substrates may be selectively withdrawn into the substrate handling module. The substrate handling module typically includes a substrate handler, which is configured to move substrates to/from the one or more load locks and to/from the one or more processing modules.

There are several general problems that are associated with prior art substrate processing stations. For example, as the substrate is moved within the processing station, the substrate can become misaligned or mispositioned for various reasons. Such mispositioning can result in damage to the substrate as it is moved within the processing station and/or errors in the fabrication process if the mispositioning occurs within a processing module. As such, some substrate processing system include several sensors to monitor the position of the substrate position. Each sensor adds to the complexity and cost of the processing system. These sensors are also typically difficult to maintain and require frequent alignment.

SUMMARY OF THE INVENTION

A need therefore exists for a more simple and accurate method for monitoring the position of the substrate within a processing system.

One embodiment of the present invention is an apparatus for detecting the presence of a substrate that is carried by an end effector of a substrate handling assembly positioned within a substrate processing system. The apparatus comprises a first receiving member that is coupled to the end effector such that the first receiving member moves with the end effector. A light sensor is operatively coupled to the first receiving member and is configured to detect an amount light transmitted by the first receiving member. A control system is operatively coupled to the light sensor and configured to indicate the presence of the substrate based upon the amount of light detected by the light sensor.

Another embodiment is a method for monitoring the position of a substrate within a substrate processing system. The method involves providing a first receiving member that is coupled to an end effector of the substrate processing system. A light detection sensor is provided and is operatively coupled to the first receiving member. The presence of a substrate is detected when the first receiving member receives a first amount of light. The absence of a substrate is detected when the first receiving member receives a second amount of light that is greater than the first amount of light.

Another embodiment is a method for monitoring the position of a substrate within a substrate processing system. The method comprises providing a first receiving member that is coupled to an end effector of the substrate processing system. A light detection sensor is operatively coupled to the first receiving member. A first transmitting member is provided and is also coupled to an end effector of the substrate processing system. A light source is provided and is operatively coupled to the first transmitting member. The presence of a substrate is detected when the first receiving member receives light from the first transmitting member that is reflected off of the substrate. The absence or misalignment of a substrate is detected when the first receiving member does not receive light from the first transmitting member.

Further aspects, features and advantages of the invention will become apparent from the following description of the preferred embodiments.

BRIEF DESCRIPTION OF THE DRAWINGS

These and other features, aspects and advantages of the present invention will now be described with reference to the drawings of preferred embodiments which are intended to illustrate and not to limit the invention. The drawings comprising FIG. 1 a schematic top plan view of a substrate processing system.

DETAILED DESCRIPTION OF THE PREFERRED EMBODIMENT

Figure 1:
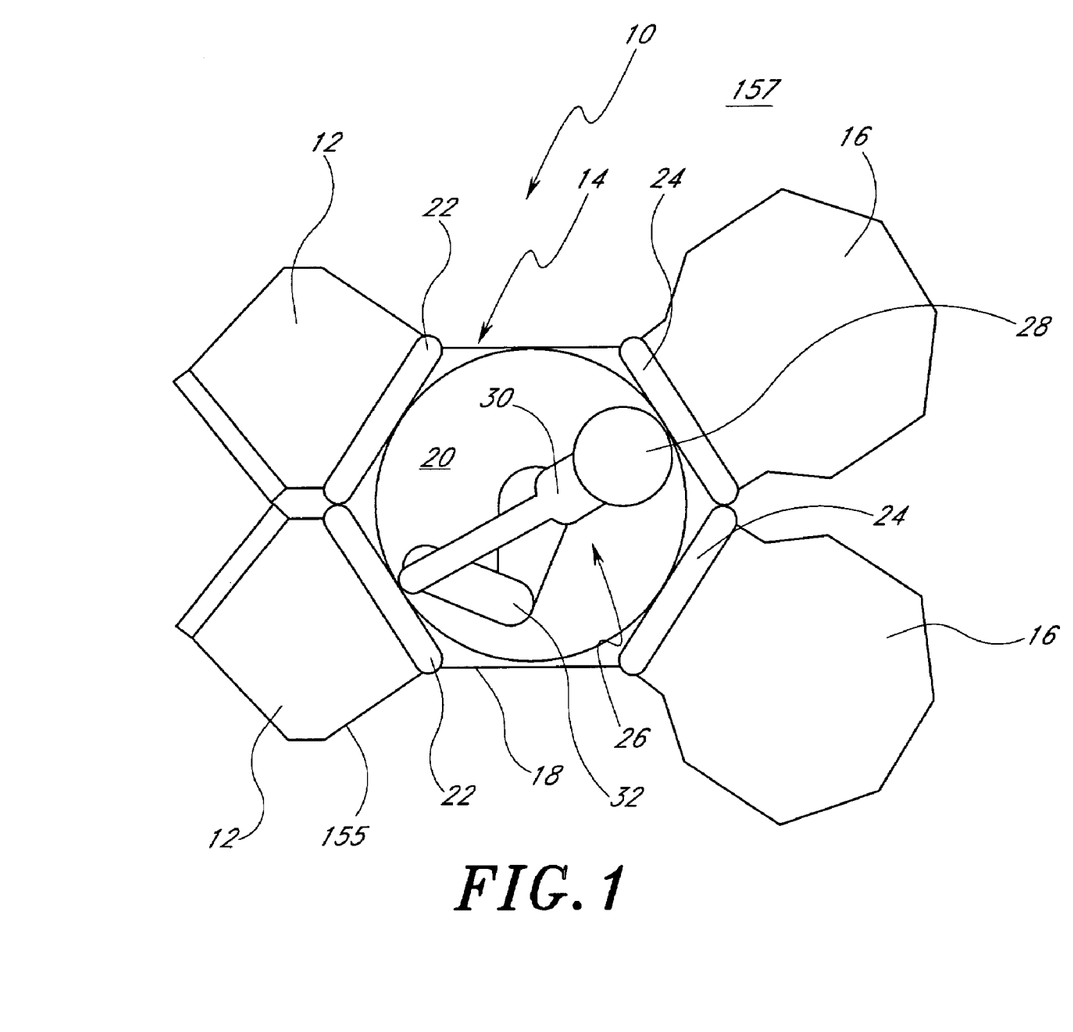

FIG. 1 illustrates an exemplary substrate processing system 10 that comprises two load locks 12, a substrate handling module 14, and two substrate processing modules 16. The substrate handling module 14 comprises a housing 18, which defines a substrate handling chamber 20. The substrate handling chamber 20 is preferably substantially closed and under vacuum. However, in modified embodiments, the substrate handling chamber can be kept a higher pressures (e.g., atmospheric).

The load locks 12 can be adapted for holding, among other things, a cassette of substrates, a plurality of single substrates and/or a single substrate. The load locks 12 are connected to the substrate handling module 14 by an opening, which is selectively opened and closed by a gate valve 22. In a similar manner, the processing modules 16 are connected to the substrate handling chamber 18 by openings, which are also selectively opened and closed by gate valves 24.

A substrate handler 26 is positioned within the substrate handling chamber 20. The substrate handler 26 is configured to transfer a substrate 28 to, from and between the load locks 12 and the processing modules 16. The substrate handler 26 includes an end effector 30, which is configured to fit between the openings that connect the load locks 12 and processing chambers 16 to the substrate handling module 14. The substrate handler 26 also includes a robot arm assembly 32. The robot arm assembly 32 is mounted to a support member (not shown) and can control movement of the end effector 30 in any manner.

Figure 2:
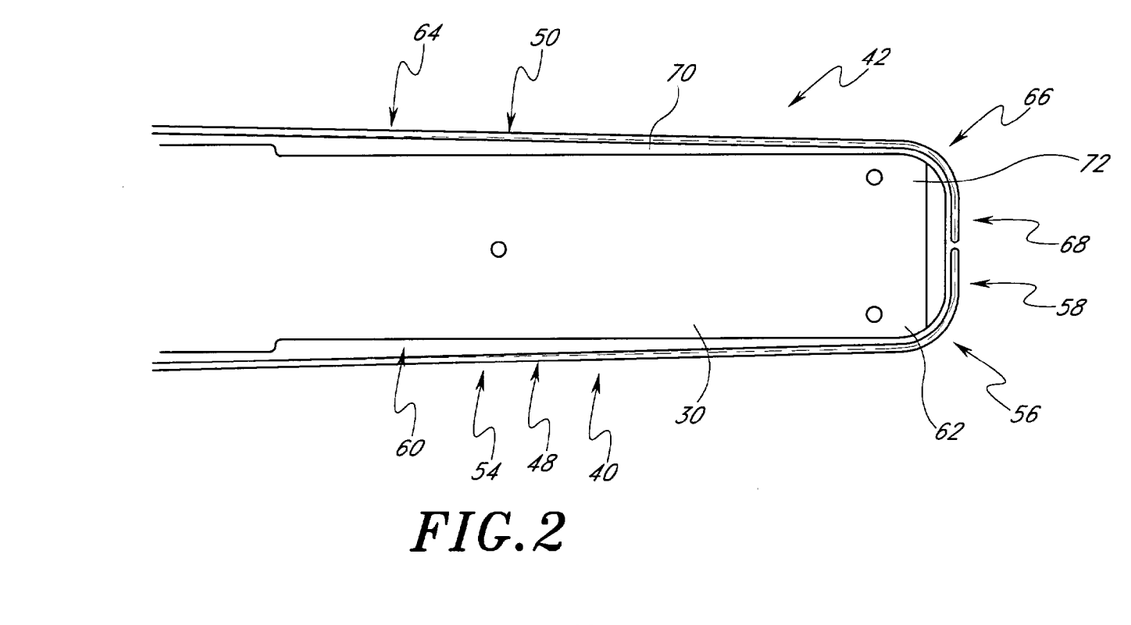
FIG. 2 is a bottom plan view of an end effector of the substrate processing system and a portion of a substrate detection system having certain features and advantages according to the present invention.
Figure 3:
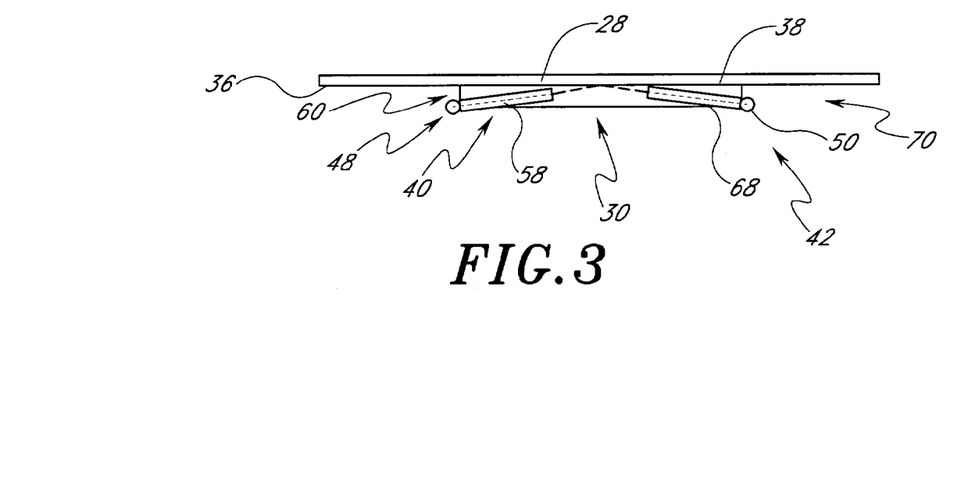
FIG. 3 is a front view of the end effector and substrate detection system of FIG. 2.

As shown in FIGS. 2 and 3, in the illustrated embodiment, the end effector 30 comprises a simple paddle or spatula, which supports the substrate 28 by contacting a lower surface 36 of the substrate 28 with an upper surface 38 of the paddle 30. The paddle 30 in some embodiments may be made of quartz so that it can engage a substrate at high temperatures (e.g., above 1000 degrees Celsius). Of course, other suitable materials may be used.

In the embodiments illustrated herein and described below, the substrate detection system 40 is shown with a paddle-type end effector 30. However, it should be appreciated that certain features and advantages of the present invention can be used with other types of end effectors 30. For example, the end effector may be a gridded type spatula as described in U.S. Pat. No. 6,331,023, a forked type end effector as described in U.S. Pat. No. 6,293,749, a Bernoulli wand as described in U.S. Pat. No. 6,242,718, an edge grip type end effector, or a vacuum grip end effector. The detection system 40 may also be used with a substrate carrier such as the substrate carrier described in U.S. patent application Ser. No. 09/256,743.

With reference to FIGS. 2–5, the end effector 30 preferably includes a substrate detection system 40 having certain features and advantages according to the present invention. In the illustrated embodiment, the detection system 40 comprises a detection portion 42 (see FIGS. 2 and 3) and a receiving/transmitting portion 44 (see FIG. 5). The detection portion 42 is preferably configured such that it moves with the end effector 30. In contrast, the receiving/transmitting portion 44 can be located on the robot arm assembly 32 and/or the support member. In the illustrated embodiment, the detection portion 42 and the receiving/transmitting portion receive and transmit light through light pipes, which may have a number of straight and bent sections to allow receiving/transmitting surfaces to be at the appropriate positioned as will be explained in more detail below.

In the illustrated embodiment, the detection portion 42 comprises a transmitting light pipe 48 and a receiving light pipe 50. Both light pipes 48, 50 are preferably formed from clear optical material and form a wave guide for transmitting light, preferably visible light. In the illustrated embodiment, the transmitting light pipe 48 includes a straight section 54, a bent section 56 and a tip portion 58 (see also FIG. 2). The straight section extends along a first longitudinal side 60 of the end effector 30. The curved section 56 preferably curves about a first front corner 62 of the end effector 30 such that the tip portion 58 lies in front of the end effector. In a similar manner, the receiving light pipe 50 of the illustrated embodiment also includes a straight section 64, a bent section 66 and a tip portion 68. The straight section 64 extends along a second longitudinal side 70 of the end effector 30. The bent section 66 curves about a second front corner 72 of the end effector 30 such that the tip portion 68 of the receiving light pipe 50 also lies in front of the end effector 30.

In the illustrated embodiment, the tip portions 58, 68 are located in front of the end effector 30 and the straight portions 54, 64 extend along the longitudinal sides 60, 70 of the end effector 30. However, it should be appreciated that the illustrated configuration of the bent and straight portions are merely exemplary. For example, in one modified embodiments, one or both tip portions 58, 68 can be located on the sides of the end effector 30. In another embodiment, the straight portions 54, 64 can be positioned underneath the end effector 30. In still another embodiments, the light pipes 48, 50 can be located adjacent to each other.

Figure 4:
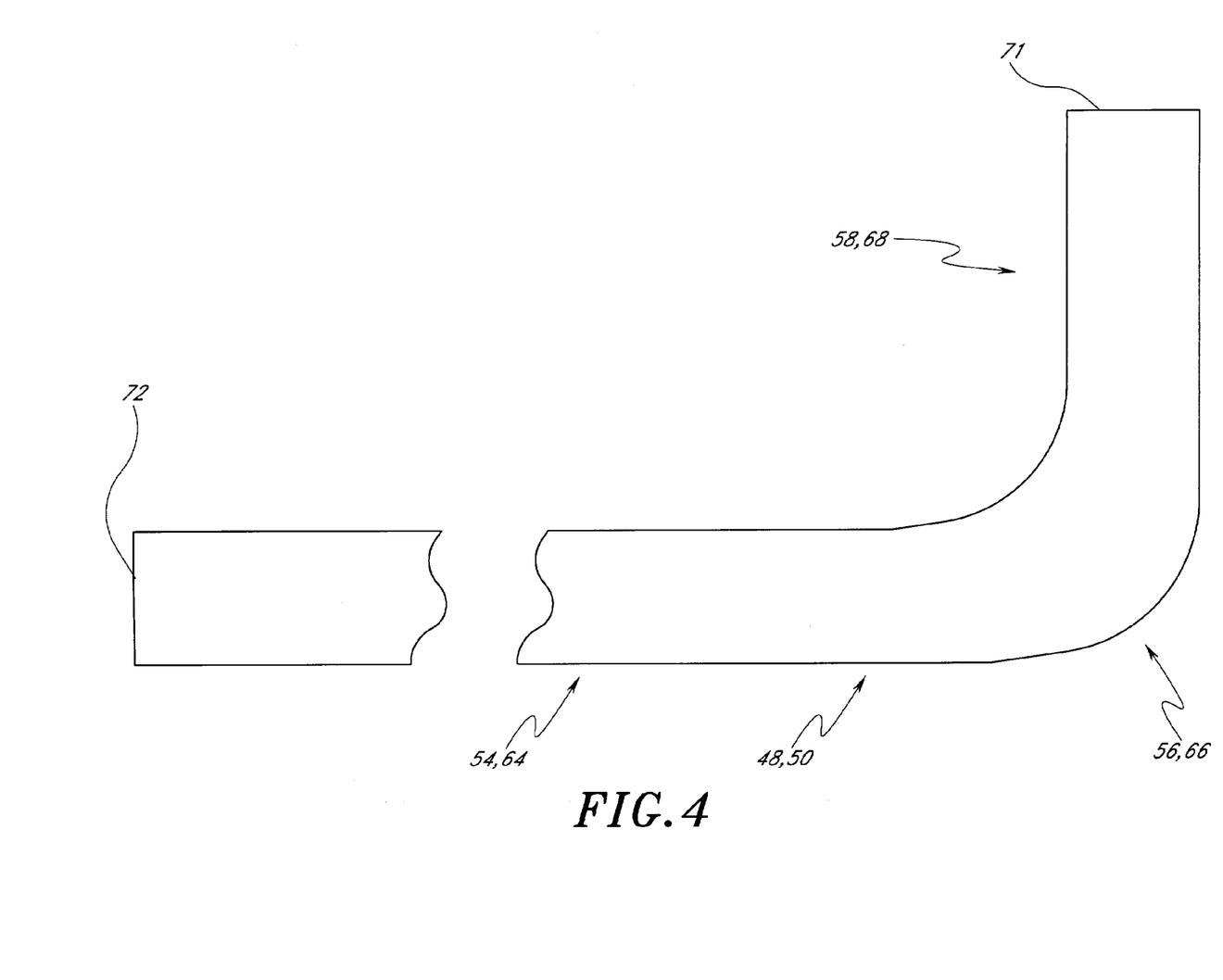
FIG. 4 is a top plan view of a light pipe of the substrate detection system of FIG. 2.

With reference to FIG. 4, the tip portions 58, 68 include transmitting/receiving surfaces 71. As shown in FIG. 3, the tip portions 58 are angled such that the transmitting/receiving surfaces point towards the lower surface 36 of the substrate 28 that is properly positioned on the end effector 30. More specifically, the tip portions 58, 68 are orientated such that a light beam emanating from the transmitting light pipe 48 will be reflected off of the lower surface 36 of the substrate 28 and be collected or received by the receiving light pipe 50.

Figure 5:
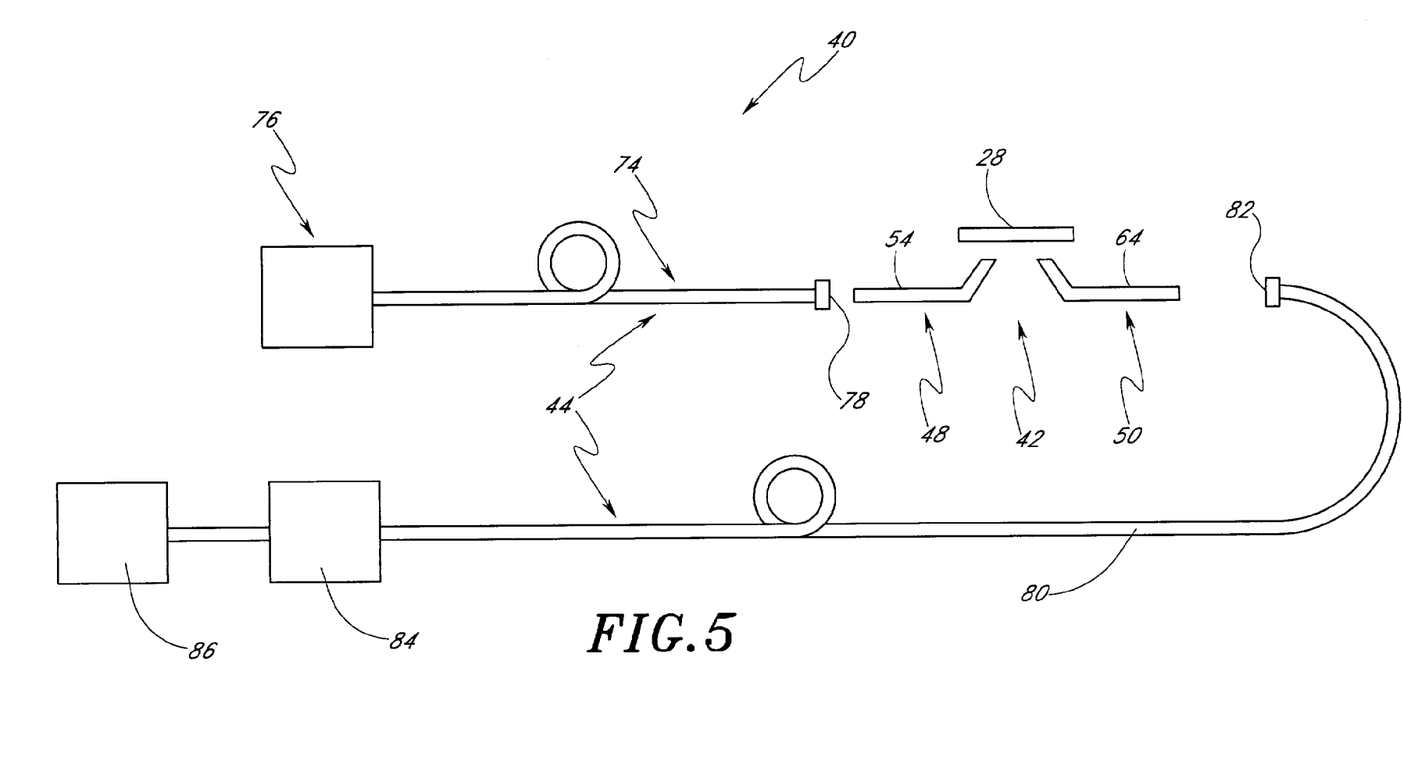
FIG. 5 is a schematic illustration of the substrate detection system of FIG. 2.

As seen in FIG. 5, in the illustrated embodiment, the straight section 54 of the transmitting light pipe 48 is operatively coupled to a connecting member 74, which preferably comprises a flexible light transmitting material, such as, for example, a fiber optic cable. The connecting member 74 is, in turn, connected to a light source 76. In one embodiment, the light source 76 is a 0.5 mW laser with a wave length of approximately 689 nanometers and in another embodiment the light source is a 48 Watt quartz lamp. A lens 78 is preferably provided on the flexible member 74 between the interface be the connecting member 74 and the transmitting light pipe 48 for gathering light transmitted by the connecting member 74.

In a similar manner, in the illustrated embodiment, the straight section 64 of the receiving light pipe 50 is connected to a second connecting member 80, which also preferably comprises a flexible light transmitting material, such as, for example, a fiber optic cable. As with the first connecting member 74, the second connecting member 80 includes a lens 82 at the interface with the receiving light pipe. The second connecting member 80 is connected to a light sensor 84 (e.g., a photo cell sensor), which is preferably operatively connected to a control system 86, as will be explained in more detail below.

Figure 6A:
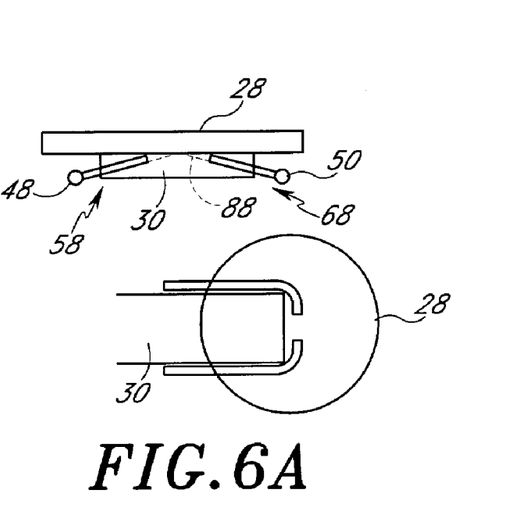
FIG. 6A–C are schematic illustrations showing the operation of the substrate detection system.
Figure 6B:
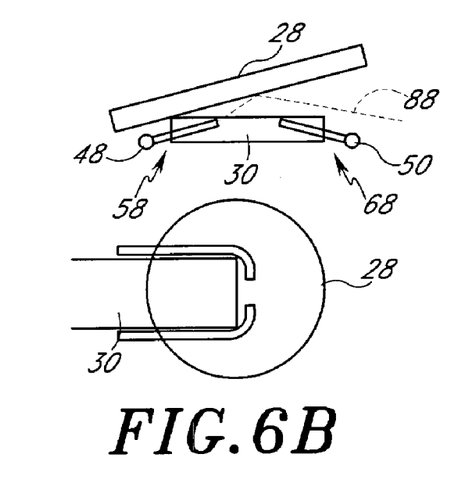
Figure 6C:
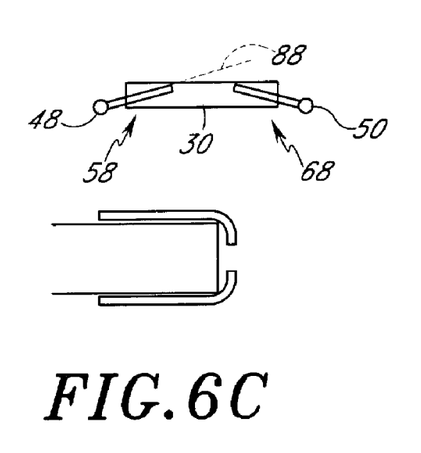

With reference to FIGS. 6A–C, the operation of the detection system 40 will now be described. In FIG. 6A, the substrate 28 is properly positioned on the end effector 30. The tip portions 58, 68 of the transmitting and receiving light pipes 48, 50 are orientated such the light 88 generated by the light source 76 (FIG. 5) and emitted from the transmitting light pipe 48 is reflected off the substrate 28 and received by the receiving light pipe 50. The light is transmitted through the receiving light pipe 50 and the flexible member 80 and detected by light sensor 84 (FIG. 5), which plight pipeuces an appropriate signal to the control system 68 (FIG. 5) to indicate that the substrate 28 is present and in the proper position.

In FIG. 6B, the substrate 28 is improperly positioned on the end effector 30. With the substrate 28 in this position, the light 88 emitted by the transmitting light pipe 48 is not received by the receiving light pipe 50 because it is reflected at an incorrect angle. As such, no light or insufficient light is detected by the light sensor 84 (FIG. 5) and an appropriate signal or lack of signal can be sent to the control system 86 (FIG. 5) indicating that the substrate 28 is improperly aligned. In a similar manner, as shown FIG. 6C, when a substrate 28 is not positioned on the end effector 30, the light 88 emitted by the transmitted light pipe 48 is not reflected and is not received by the receiving light pipe 50. The light sensor 84 (FIG. 5), therefore, does not receive a light signal and an appropriate signal can be sent to the control system 86 (FIG. 5).

In a modified embodiment, the end effector 30 can be provided with one or more additional pairs of transmitting and receiving light pipes. The additional pairs can be used in combination with the transmitting and receiving light pipes described above to determine the position of the substrate on the end effector 30. That is, the additional pair can be used to determine the edge of the substrate 28.

Figure 7A:
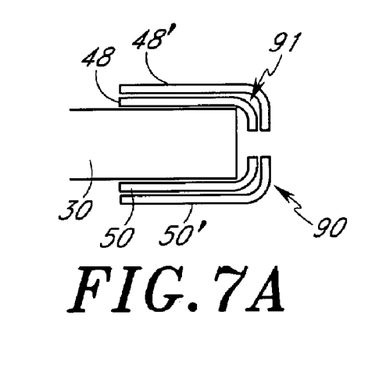
FIG. 7A–C are schematic illustrations showing the operation of a modified embodiment of the substrate detection system.
Figure 7B:
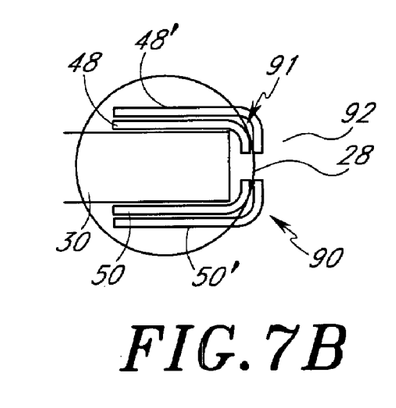
Figure 7C:
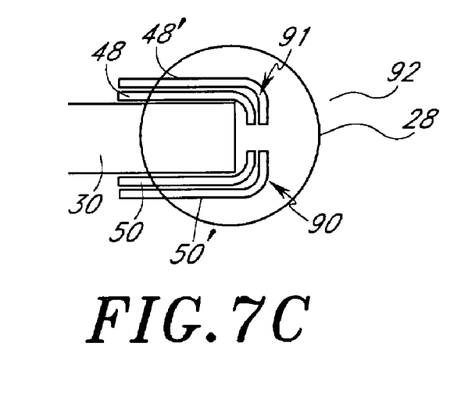

For example, as shown in FIG. 7A, a second pair 90 of transmitting and receiving light pipes 48', 50' can be spaced further from the tip of the end effector 30. Though not illustrated, it will be understood that each of the pairs ins angled upwardly to bounce and receive light off the wafer bottom surface, as illustrated in FIGS. 6A–C. When no wafer is present, as illustrated in FIG. 7A, neither of the receiving light pipes 50, 50' receives light and thus the control system 86 (FIG. 5) would indicate that a substrate is not present. When a substrate 28 is present as shown in 7B, the receiving light pipe 50 of the first pair 91 receives reflected light while the receiving light pipe 50' of the second pair 90 does not. Such a situation indicates that a substrate 28 is present on the end effector 30 and is in a position wherein the edge 92 of the substrate 28 lies between the first and second pairs of light pipes 91, 90. When the substrate 28 is positioned as illustrated in FIG. 7C, the receiving light pipes 50, 50' of both pairs 91, 90 receive reflected light. Such a situation indicates that the substrate 28 is present and that the edge 92 of the substrate 28 is located past the second pair of light pipes 90.

It should be noted that, in the above-described embodiments, the light sensor 84 (FIG. 5) can be configured such that it is powered (i.e., generates electricity) from the light received from the light source 76. Such an arrangement eliminates the need for a power source (e.g., a battery) for the light sensor 84.

FIGS. 8–11 illustrate another embodiment of a substrate detection system 100 having certain features and advantages according to the present invention. The illustrated detection system 100 comprises a shadow detection portion 102, that as with the previous embodiment, is configured to move with the end effector 30.

Figures 8, 9:
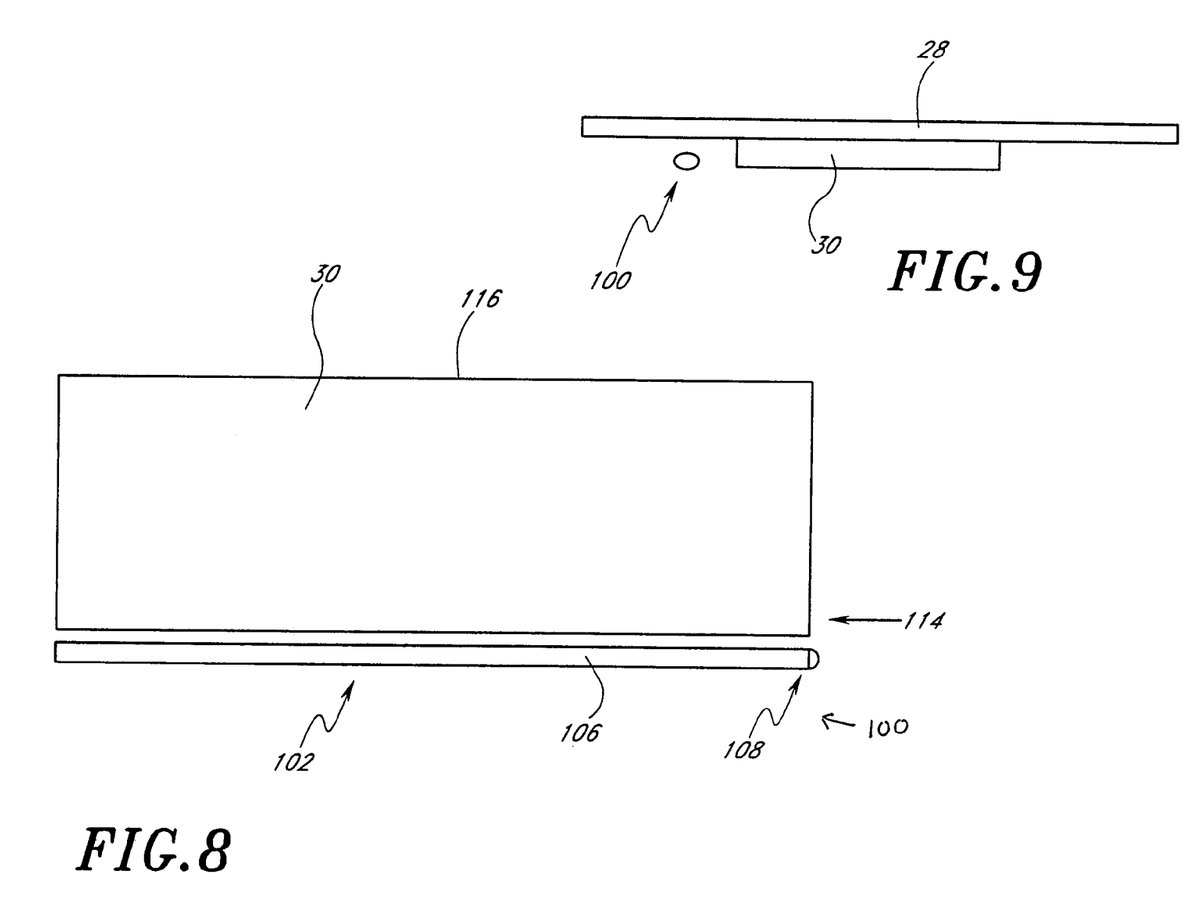
FIG. 8 is a top plan view of the end effector with a portion of another modified embodiment of a substrate detection system.
FIG. 9 is a front view of the end effector and substrate detection system of FIG. 8.
Figure 10:
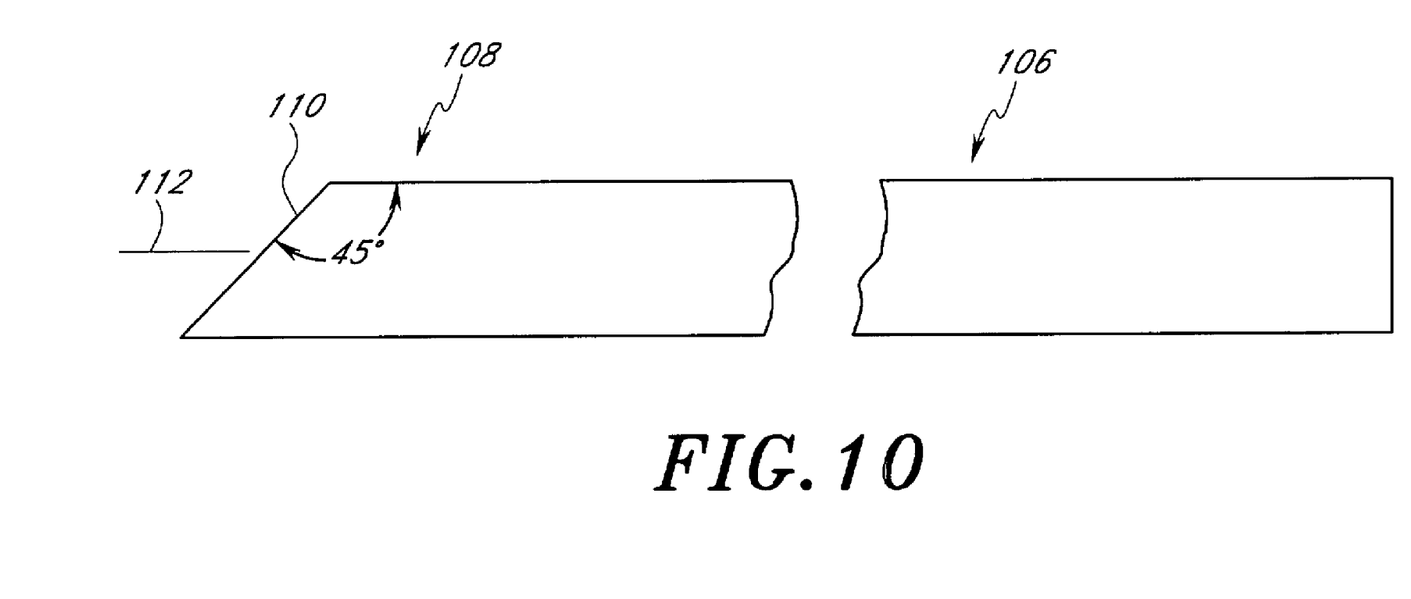
FIG. 10 is a top plan view of a light pipe of the substrate detection system of FIGS. 8 and 9.

As with the previous embodiment, the detection portion 102 comprises a light pipe that is preferably formed from optically transparent material that forms a wave guide for transmitting light (preferably visible light) as will be explained below. In the illustrated embodiment, the detection portion 102 includes a straight section 106 and a tip portion 108, which is best seen in FIG. 10. As shown, in FIG. 10, the tip portion 108 preferably comprises a well-polished face 110 that forms approximately a 45 degree angle with respect to a longitudinal axis 112 of the elongated portion 106. The tip portion 108 is configured to detect a shadow as will be explained in more detail below. As best seen in FIGS. 8 and 9, in the illustrated embodiment, the tip portion 108 is generally located near a front end 114 of the end effector 30. However, this particular position is merely exemplary. For example, the tip portion 108 may be located on along a side 116 of the end effector 30. In still other embodiments, the elongated portion 106 may extend under the end effector 30. The elongated portion 106 may also be bent, for example, in a manner as shown FIGS. 2 and 3.

Figure 11:
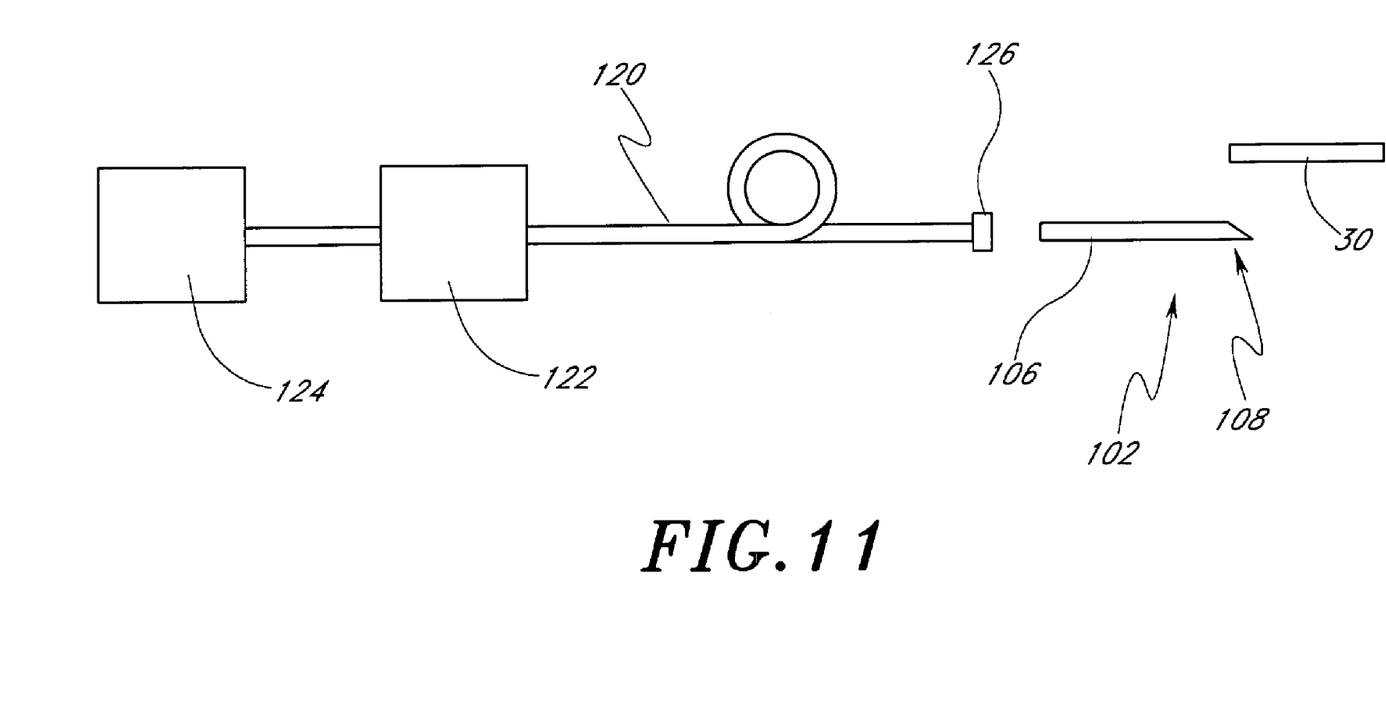
FIG. 11 is a schematic illustration of the substrate detection system of FIGS. 8 and 9.

With reference now to FIG. 11, the elongated portion 106 is preferably connected to a connecting member 120, such as the flexible connecting members described above. The flexible connecting member 120 is connected to a photo cell or light sensor 122, which is preferably operatively connected to a control system 124 as will be explained in more detail below. The flexible connecting member 120 preferably includes a lens 126 at the interface between the flexible connecting member 120 and the elongated portion 106.

Figures 12A, 12B, 14:
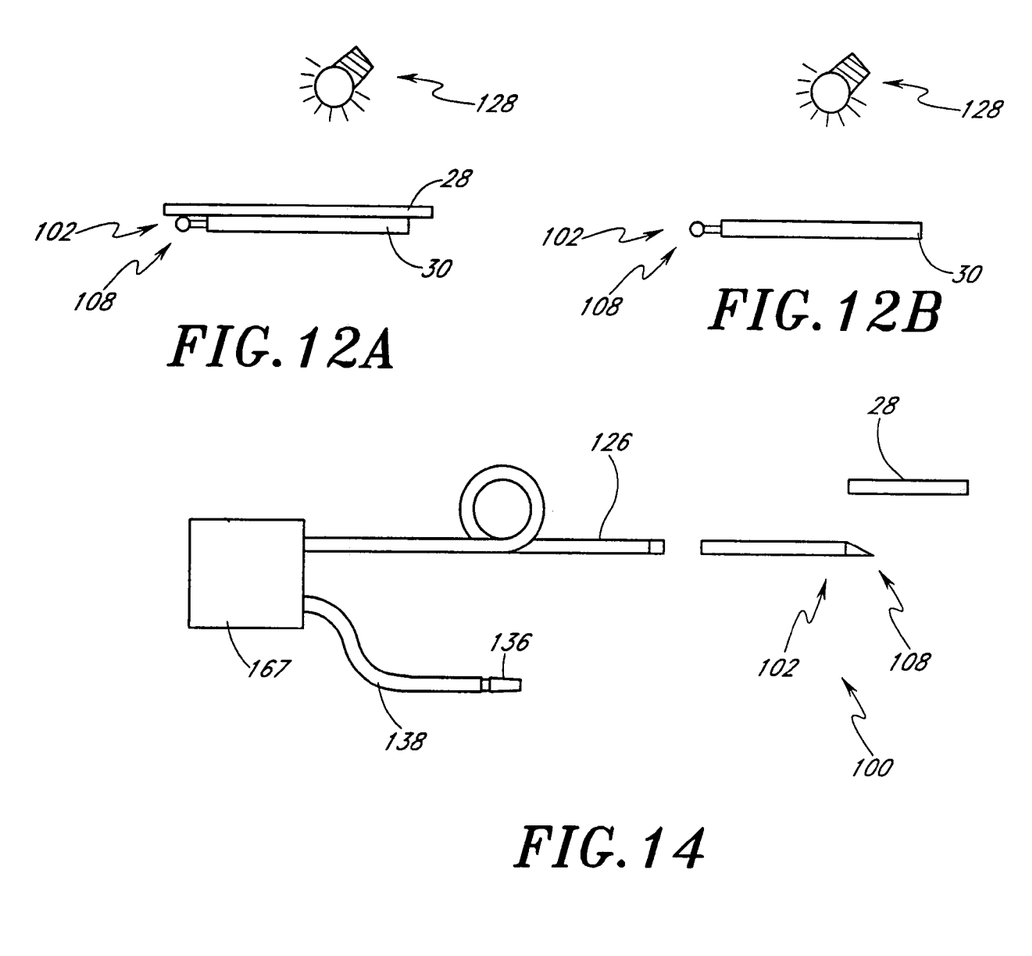
FIGS. 12A and 12B are schematic illustrations of a front view of the detection system of FIGS. 8 and 9 showing the operation the substrate detection system.
FIG. 14 is a schematic illustration of another modified embodiment of a substrate detection system.

The operation of the detection system 100 will now be described with reference to FIGS. 12A and 12B. In FIG. 12A, the substrate 28 is positioned on the end effector 30. The tip portion 108 of the detection portion 102 is under the substrate 28. As such, the substrate 28 blocks the light 128 (e.g., visible light) from being received by the detection portion 102. That is, the tip portion 108 is located in the "shadow" of the substrate 28. As such, no light or a very small amount light is being received by the tip portion 108 and no or a very small amount of light is transmitted to the light sensor 122. The control system 124 (FIG. 11) can be calibrated to interpret such a situation as indicating that a substrate is present on the end effector 30.

The light 128 can be ambient light (i.e., light typically present in the processing system 10) or light from a supplemental light source (i.e., a light source added specifically to aid the detection system 100). The ambient light or supplemental light source may be positioned within or outside the processing system 10 (FIG. 1). In the embodiments where the ambient or supplemental light is positioned outside the processing system 10, the processing system 10 may include windows for allowing the ambient or supplemental light to pass into the processing or handling chambers 20.

In FIG. 12B, there is no substrate 28 on the end effector 30. As such, the tip portion 108 is no longer in the "shadow" of the substrate 28. The tip portion 108, therefore, can receive ambient light 128 or light from a supplemental light source. Such light is transmitted to the light sensor 122, indicating that a substrate is not present.

In a modified embodiment, the end effector can be provided with one or more additional shadow detection portions. The shadow detection portions can be used in combination to determine the position of a substrate on the end effector in a manner similar to that described above.

Figure 13A:
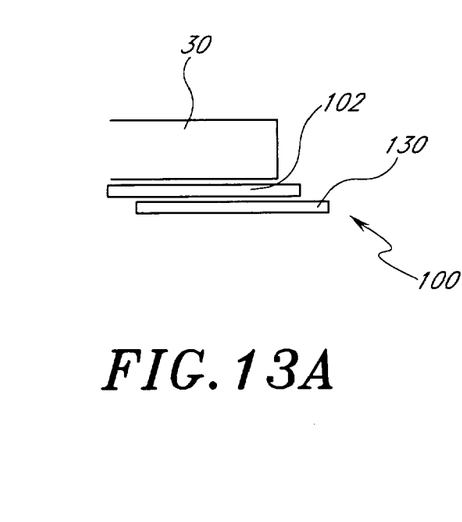
FIGS. 13A–C are schematic illustrations of a top view of the detection system of FIGS. 8 and 9 showing the operation of the substrate detection system.
Figure 13B:
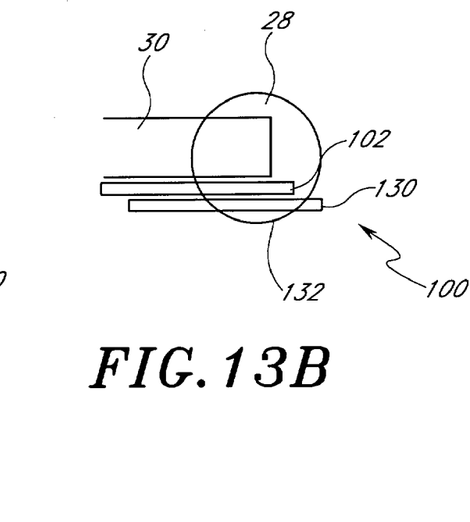
Figure 13C:
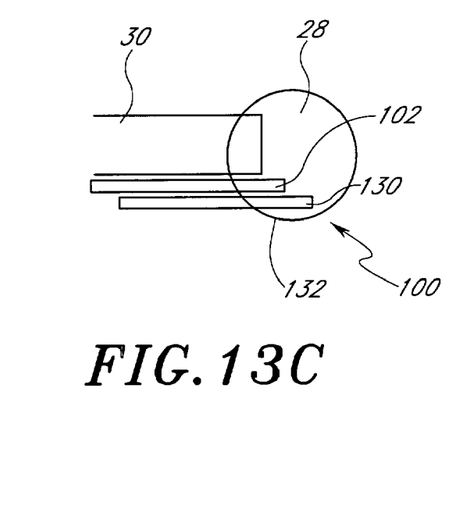

For example, as shown in FIG. 13A, the end effector 30 includes a second shadow detection portion 130 that is be distanced further from the tip of the end effector as compared to the first detection portion 102. While not shown, the tip can be angled as described with respect to FIG. 10. When a substrate is absent as illustrated in FIG. 13A, both shadow detection portions 102, 130 receive light and thus the control system indicates the absence of a substrate. When a substrate 28 is positioned as shown in 13B, the first shadow detection portion 102 is under the shadow of the substrate 28 while the second detection portion 130 receives light. Such a situation indicates that a substrate 28 is present on the end effector 30 and that the edge 132 of the substrate is located between the tip portions of the first and second shadow detection portions 102, 130. When the substrate 28 is positioned as illustrated in FIG. 13C, the tips of the shadow detection portions 102, 130 are both under the shadow of the substrate 28. This situation indicates that the substrate 28 is present and that the edge 132 of the substrate 28 is positioned beyond the tip of the second shadow detection portion 130.

In another modified embodiment, the detection systems 100 of FIG. 8 or 13A can include an ambient light sensor 136 (See FIG. 14). The ambient light sensor 136 can be positioned on the end effector 30 such that it is not affected by the presence or absence of a substrate. In other embodiments, the ambient light sensor 136 can be positioned on one or more stationary portions of the substrate processing system 10 (FIG. 1) or on a portion of the substrate handler 26 (FIG. 1). As shown in FIG. 14, the ambient light sensor 136 is preferably connected by a member 138 to a second light sensor 167, which is also connected to the control system 124. The presence or absence of a substrate can therefore be determined by comparing the signals of the first light sensor 22 to second light sensor 167. Such an arrangement reduces errors that may be associated with changes in the ambient light and reduces the time necessary to calibrate the detection system.

The embodiments described above have several advantages as compared to prior art substrate detection systems. For example, prior art substrate detection systems typically require multiple sensors to sense the position of the substrate as the substrate is moved between the load locks, the substrate handling module and the processing modules. In the illustrated embodiments, the detection portions of the detection system preferably are mounted onto and move with the end effector. This arrangement reduces the need for multiple sensors and thereby results in fewer parts, less installation time and less maintenance time. In addition, the detection portions preferably are made of quartz, which can withstand temperatures up to about 1100 degrees Celsius. As such, the detection portions may even be inserted into the processing modules of the substrate processing system. In contrast, mirrors and electrical sensors, which are often used in prior art detection systems, typically cannot be inserted in the processing modules due to the high temperatures.

Figure 15:
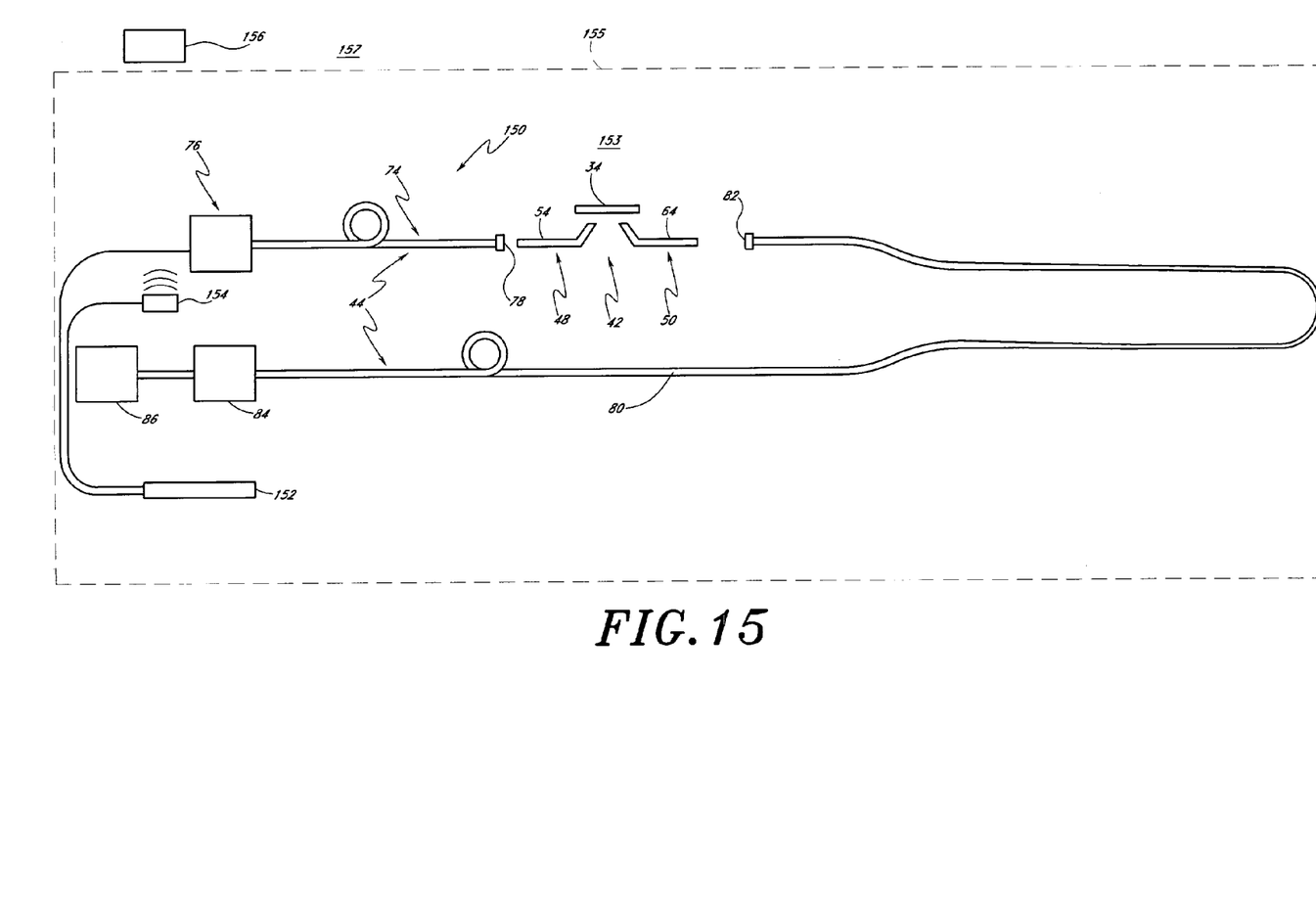
FIG. 15 is a schematic illustration of still another modified embodiment of a substrate detection system.

FIG. 15 illustrates another embodiment of a substrate detection system wherein like numbers are used to refer to parts similar to those of FIG. 5. In this embodiment, the detection system 150 includes an internal power source 152 and a wireless transmission device 154. As will be explained in more detail below, the wireless transmission device 154 can be used to transmit information regarding the position of the substrate between a sealed processing environment 153 an outer clean room or gray room 157, which is separated by a wall 155 from the sealed processing environment 153. That is, the information is transmitted through the walls 155 without the need for wires that extend through such walls 155. With reference to FIG. 1, in the illustrated embodiment, the wall 155 corresponds to the walls of the substrate processing system 10 (i.e., the walls of the load locks 12, substrate handling module 14, and processing chambers 20). As such, the sealed processing environment 153 is the space within the processing system 10, which is surrounded, at least partially, by the outer clean room or gray room 157.

In a preferred embodiment, the internal power source 152 comprises a photoelectric cell or "solar" cell, which can convert ambient light or light from a supplemental light source to electricity. The electricity generated by the internal power source 152 can be used to power the light source 76, the light detection device 84, and/or the control system 86, and/or the transmission device 154. The signals from the control system are preferably transmitted by the wireless communication device 154 to a more comprehensive substrate processing control system 156, which is preferably located outside or external to the sealed environment 153 (i.e., the substrate processing system 10). The signals can be used by the substrate processing control system 156 to monitor the position of the substrate as it moves through the processing system 10. The wireless communication device 154 is also preferably powered by the power source 152. In one embodiment, the wireless communication device 154 is a low power IR transmitter. In such an embodiment, the wall 155 preferably includes a window through which the IR signal can be transmitted. In another embodiment, the wireless communication device 154 is a low power RF transmitter. Preferably, the detection system 150 also includes a regulator and a storage cap battery that can be charged by the solar cell (power source) 152 to provide power during periods of darkness.

The embodiment described above has several advantages. For example, as compared to an external power source (e.g., a direct electrical connection), there are no physical connections (e.g., wires) between the external power source and the components of the detection system. Such wires increase the complexity of the system and may become damaged during the operation of the wafer handler. Wire movement may also cause particle generation and require additional seals in the processing system. Other internal power sources, e.g., batteries, require frequent downtime to open the processing system 10 and replace or maintain the power source when the power is drained. The wireless communication device also eliminates physical connections (e.g., wires) between the substrate detection system 150 and the substrate control system 160, which further reduces the complexity of the detection system 150. In addition, the processing system can be retrofitted with additional sensors without adding additional wires, which can create more particle generation.

It should be appreciated that certain features of the system 150 described above can also be used with the embodiments described with reference to FIGS. 1–14. Moreover, in certain embodiments, the internal power source 152 may be used without the wireless communication device 154 and in other embodiments, the wireless communication device 154 may be used without the internal power source 152.

It should also be appreciated that the internal power source and/or the wireless communication device may be used to transmit information between devices in the sealed processing environment and the outer room. In particular, an internal power source and/or a wireless communication device can be mounted on other devices that move within the sealed substrate processing environment apart from the substrate detection system described above. In other embodiments, the internal power source and/or the wireless communication device described above may be used with sensors on other devices or other moving parts within the sealed semiconductor processing chamber, such as, for example, temperature sensors on a rotating support structure or surrounding ring inside a processing chamber. The internal power source and/or the wireless communication device can be used with other types of sensors besides or in addition to the substrate detection system.

Figure 16:
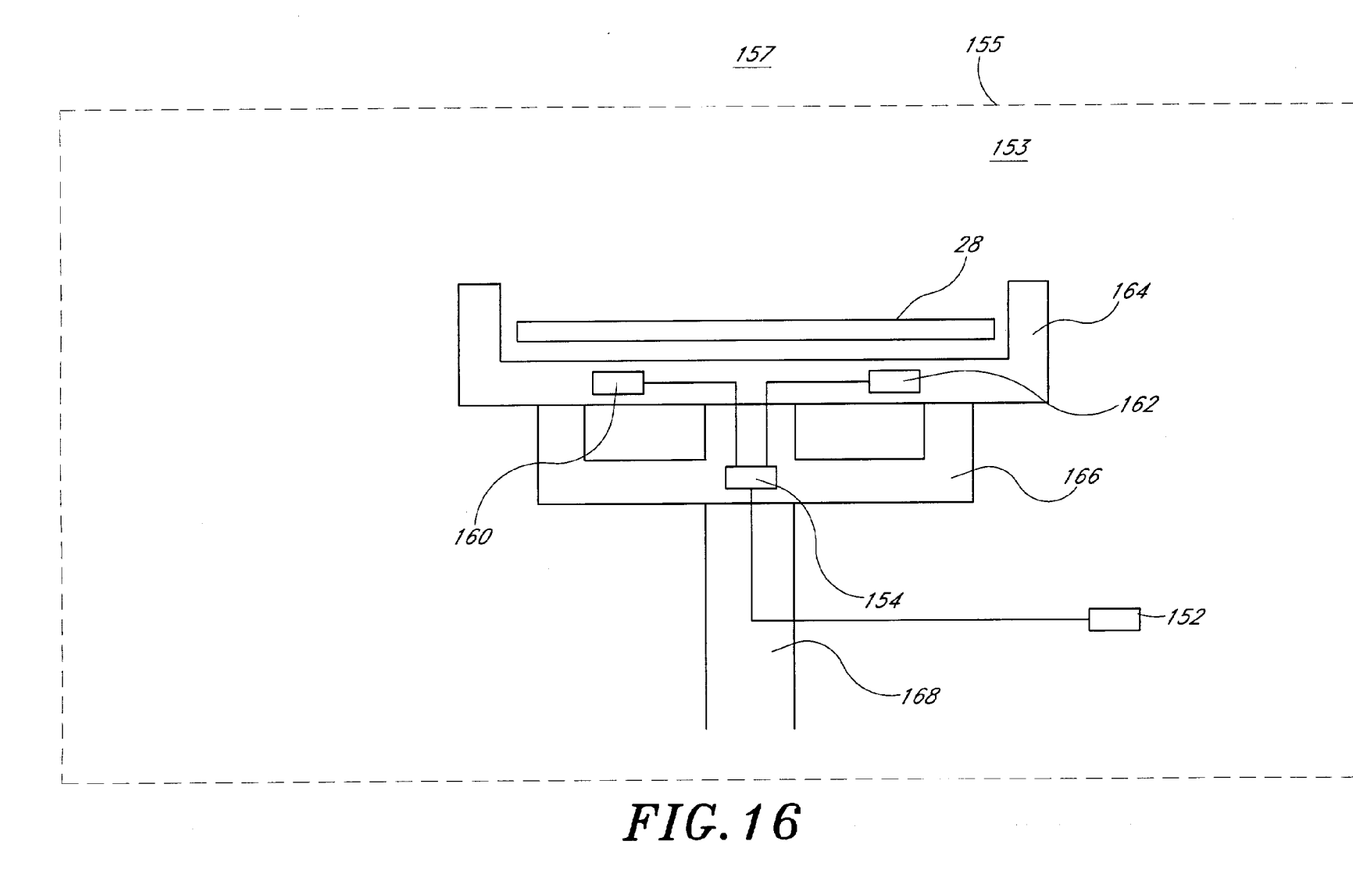
FIG. 16 is a schematic illustration of a temperature sensor system.

For example, as shown in FIG. 16, the internal power source 152 and/or the wireless communication device 154 may be used with a temperature measurement system (e.g., a series of temperatures sensors 160) or a gas composition detection sensor 162. In the illustrated embodiment, the temperature sensors and gas sensors are placed on a generally flat circular susceptor 164, which is supported by a spider 166 within the sealed environment 153 of, for example, a processing chamber. The spider 166 is mounted on a tubular shaft 168 which may extends through the processing chamber. Details of such an arrangement together with a drive mechanism can be found in U.S. Pat. No. 4,821,674, which is incorporated herein by reference. In the illustrated embodiment, the wireless communication device 154 is placed on the spider. In a modified arrangement, the wireless communication device can be powered by an internal power source that is mounted, for example, on the spider 166.

Of course, the foregoing description is that of preferred embodiments of the invention and various changes, modifications, combinations and sub-combinations may be made without departing from the spirit and scope of the invention, as defined by the appended claims.

We claim:

1. An apparatus for detecting the presence of a substrate that is carried by an end effector of a substrate handling assembly positioned within a substrate processing system, the apparatus comprising:
    a first receiving member that is coupled to the end effector such that the first receiving member moves with the end effector;
    a light sensor that is operatively coupled to the first receiving member and is configured to detect an amount of light received by the first receiving member; and
    a control system operatively coupled to the light sensor and configured to indicate the presence of the substrate based upon the amount of light detected by the light sensor;
    wherein a tip portion of the first receiving member is positioned such that, when the substrate is properly carried by the end effector in a first position, the substrate substantially blocks ambient light from being received by the tip portion of the first receiving member and wherein the apparatus does not include a transmitting member coupled to the end effector and configured to transmit light into the first receiving member.

2. The apparatus as in claim 1, wherein the first receiving member comprises a quartz rod.

3. The apparatus as in claim 1, comprising a flexible connector member that operatively couples the first receiving member to the light sensor.

4. The apparatus as in claim 3, wherein the flexible connector member comprises a fiber optic cable.

5. The apparatus as in claim 1, wherein the first receiving member comprises a polished face that is orientated approximately 45 degrees with respect to a longitudinal axis of the first receiving member.

6. A method for monitoring the position of a substrate within a substrate processing system, comprising:
    providing an end effector that includes a first receiving member that is coupled to an end effector of the substrate processing system and does not include a transmitting member coupled to the end effector;
    providing a light detection sensor, which is operatively coupled to the first receiving member;
    detecting the presence of a substrate when the first receiving member receives a first amount of light from an ambient light source; and
    detecting the absence of a substrate when the first receiving member receives a second amount of ambient light that is greater than the first amount of ambient light.

7. The method as in claim 6, wherein, when the substrate is present and properly orientated, the substrate substantially blocks ambient light from entering the first receiving member.

* * * * *